US012635525B2

(12) United States Patent
Yu et al.

(10) Patent No.: US 12,635,525 B2
(45) Date of Patent: May 19, 2026

(54) CHIP PACKAGE HAVING FOUR SIDES PROVIDED WITH ELECTROMAGNETIC INTERFERENCE SHIELDING LAYERS AND METHOD OF MANUFACTURING THE SAME

(71) Applicant: WALTON ADVANCED ENGINEERING, INC., Kaohsiung (TW)

(72) Inventors: Hong-Chi Yu, Kaohsiung (TW); Chun-Jung Lin, Kaohsiung (TW); Ruei-Ting Gu, Kaohsiung (TW)

(73) Assignee: WALTON ADVANCED ENGINEERING, INC., Kaohsiung (TW)

( * ) Notice: Subject to any disclaimer, the term of this patent is extended or adjusted under 35 U.S.C. 154(b) by 355 days.

(21) Appl. No.: 18/226,786

(22) Filed: Jul. 27, 2023

(65) Prior Publication Data

US 2024/0063138 A1 Feb. 22, 2024

(30) Foreign Application Priority Data

Aug. 19, 2022 (TW) .................................. 111131261

(51) Int. Cl.
| | |
|---|---|
| *H01L 23/532* | (2006.01) |
| *H01L 21/56* | (2006.01) |
| *H01L 21/768* | (2006.01) |
| *H01L 23/00* | (2006.01) |
| *H01L 23/31* | (2006.01) |
| *H01L 23/367* | (2006.01) |

(Continued)

(52) U.S. Cl.
CPC ......... *H10W 42/20* (2026.01); *H10W 20/044* (2026.01); *H10W 40/22* (2026.01); *H10W 74/014* (2026.01); *H10W 74/019* (2026.01); *H10W 74/117* (2026.01); *H10W 74/00* (2026.01); *H10W 90/734* (2026.01)

(58) Field of Classification Search
CPC ............... H01L 23/552; H01L 23/3128; H01L 23/3675; H01L 24/32; H01L 2224/32225; H01L 2924/1811; H01L 2924/3025; H10W 42/20; H10W 74/019; H10W 74/014; H10W 74/117; H10W 74/00; H10W 20/044; H10W 40/22; H10W 90/734
See application file for complete search history.

(56) References Cited

U.S. PATENT DOCUMENTS

| | | | | |
|---|---|---|---|---|
| 8,268,677 B1 * | 9/2012 | Pagaila | ................... | H01L 21/56 |
| | | | | 257/E21.502 |
| 2012/0286415 A1 * | 11/2012 | Sakai | ................. | H01L 25/0655 |
| | | | | 257/734 |

(Continued)

*Primary Examiner* — Peniel M Gumedzoe
(74) *Attorney, Agent, or Firm* — Fei-hung Yang

(57) ABSTRACT

A chip package having four sides provided with electromagnetic interference (EMI) shielding layers correspondingly and a method of manufacturing the same are provided. The four EMI shielding layers are made of metals, located on four lateral sides of the chip package, and completely covering four lateral sides of a substrate and four lateral sides of an insulating layer to prevent at least one first circuit layer, at least one second circuit layer, and at least one chip from electromagnetic interference. Moreover, the EMI shielding layers help to improve heat dissipation efficiency of the first circuit layer, the second circuit layer, and the chip.

4 Claims, 9 Drawing Sheets

(51) Int. Cl.

| | |
|---|---|
| *H10W 20/00* | (2026.01) |
| *H10W 40/22* | (2026.01) |
| *H10W 42/20* | (2026.01) |
| *H10W 74/01* | (2026.01) |
| *H10W 74/10* | (2026.01) |
| *H10W 74/00* | (2026.01) |
| *H10W 90/00* | (2026.01) |

(56) References Cited

U.S. PATENT DOCUMENTS

| | | | |
|---|---|---|---|
| 2018/0158782 A1* | 6/2018 | Kawabata | ............. H01L 23/552 |
| 2020/0161252 A1* | 5/2020 | Yang | .................... H01L 21/568 |

* cited by examiner

CHIP PACKAGE HAVING FOUR SIDES PROVIDED WITH ELECTROMAGNETIC INTERFERENCE SHIELDING LAYERS AND METHOD OF MANUFACTURING THE SAME

CROSS-REFERENCE TO RELATED APPLICATIONS

This non-provisional application claims priority under 35 U.S.C. § 119(a) on Patent Application No(s). 111131261 filed in Taiwan, R.O.C. on Aug. 19, 2022, the entire contents of which are hereby incorporated by reference.

BACKGROUND OF THE INVENTION

The present invention relates to a chip package and a method of manufacturing the same, especially to a chip package having four sides provided with electromagnetic interference (EMI) shielding layers correspondingly and a method of manufacturing the same.

Semiconductor chips have been applied to different fields including computers, mobile phones, automobiles, medical science, etc. However, while in use, electromagnetic waves in the environment cause electromagnetic interference to the chips and the electromagnetic interference (EMI) may degrade the performance of the chip or even stop the chip from functioning. Thus there is room for improvement and there is a need to provide a chip package with electromagnetic interference shielding layers for the semiconductor chips available now.

SUMMARY OF THE INVENTION

Therefore, it is a primary object of the present invention to provide a chip package having four sides provided with electromagnetic interference (EMI) shielding layers correspondingly and a method of manufacturing the same. The four EMI shielding layers made of metals are located on four lateral sides of the chip package correspondingly and covering four lateral sides of a substrate and four lateral sides of an insulating layer completely to prevent at least one first circuit layer, at least one second circuit layer, and at least one chip from electromagnetic interference (EMI). Moreover, the respective EMI shielding layers help to improve heat dissipation efficiency of the first circuit layer, the second circuit layer, and the chip.

In order to achieve the above object, a chip package having four sides provided with electromagnetic interference (EMI) shielding layers correspondingly and a method of manufacturing the same according to the present invention are provided. The chip package is a rectangular body with four lateral sides and composed of a substrate, at least one first circuit layer, at least one second circuit layer, at least one chip, an insulating layer, and four electromagnetic interference (EMI) shielding layers. The substrate consists of a first surface, a second surface opposite to the first surface, and four lateral sides. At least one hole is formed and disposed on the first surface of the substrate. The first circuit layer is disposed on the first surface of the substrate and extending to an inner surface of the hole of the substrate. The first circuit layer is provided with a first surface. The second circuit layer is arranged at the second surface of the substrate. The first circuit layer is extending to and electrically connected with the second circuit layer by the hole of the substrate while the chip is electrically connected with and disposed on the first surface of the first circuit layer. The insulating layer is mounted to the substrate, covering the chip, and provided with four lateral sides. The respective lateral sides of the insulating layer and the respective lateral sides of the substrate are located on the same sides correspondingly. The respective EMI shielding layers made of metals are located on the respective lateral sides of the chip package and completely covering the respective lateral sides of the substrate and the respective lateral sides of the insulating layers. The chip is first electrically connected with first surface of the first circuit layer and then extending to the second circuit layer by the first circuit layer on the inner surface of the hole. Thereby the chip is electrically connected with the outside by the second circuit layer. The chip package is formed by cutting of a support board which includes a first surface and a second surface opposite to each other. A plurality of the chip packages is arranged in an array at the support board and a cutting area is formed between the two adjacent chip packages. Each of the cutting areas is provided with a slot which is penetrating from the first surface to the second surface of the support board. The respective slots are located on the respective lateral sides of the substrate and the respective lateral sides of the insulating layer of the chip package correspondingly. The respective slots are fully filled with a metal paste. The cutting is performed by using cutting tools to cut the support board along the respective cutting areas. A cutting channel whose width or diameter is smaller than that of the slot is formed on the respective cutting areas after the cutting. A part of the slot and a part of the metal paste are also removed along with formation of the cutting channel. The rest part of the metal paste not cut yet is left on the respective lateral sides of the respective chip packages to form the respective EMI shielding layers of the respective chip packages.

A method of manufacturing a chip package having four sides provided with electromagnetic interference (EMI) shielding layers correspondingly according to the present invention includes the following steps. Step S1: providing a support board which includes a first surface, a second surface opposite to the first surface, and a plurality of chip packages arranged in an array thereon. The chip package is a rectangular body with four lateral sides and composed of a substrate, at least one first circuit layer, at least one second circuit layer, at least one chip, and an insulating layer. The substrate consists of a first surface, a second surface opposite to the first surface, and four lateral sides. At least one hole is formed and disposed on the first surface of the substrate. The respective first circuit layers are disposed on the first surface of the substrate and extending to an inner surface of the respective holes of the substrate. The first circuit layer is provided with a first surface. The second circuit layer is arranged at the second surface of the substrate while the first circuit layer is extending to and electrically connected with the second circuit layer by the respective holes of the substrate. The chip is electrically connected with and disposed on the first in surface of the first circuit layer. The insulating layer is mounted to the substrate, covering the respective chips, and provided with four lateral sides. The respective lateral sides of the insulating layer and the respective lateral sides of the substrate are located on the same side. The chip is first electrically connected with first surface of the first circuit layer and then extending to the second circuit layer by the first circuit layer on the inner surface of the hole. Thereby the chip is electrically connected with the outside by the second circuit layer. A cutting area is formed between the two adjacent chip packages. Step S2: forming at least one slot on the respective cutting areas of the support board and the slot is penetrating from the first surface of the support board to the second surface of the support board. The respective slots are located on the respective lateral sides of the substrate and the respective lateral sides of the insulating layer of the chip package correspondingly. Step S3: filling the slot with a metal paste fully. Step S4: cutting the support board along the respective cutting areas by using cutting tools to form a plurality of the chip packages. After the cutting, a cutting channel whose width or diameter is smaller than that of the slot is formed on each of the cutting areas while a part of the slot and a part of the metal paste are also removed along with formation of the cutting channel. The rest part of the metal paste not cut yet is left on an outer edge of the respective chip packages to form the respective EMI shielding layers of the respective chip packages. The EMI shielding layers are located at the lateral sides of the chip package correspondingly and completely covering the respective lateral sides of the substrate and the respective lateral sides of the insulating layer.

DETAILED DESCRIPTION OF THE PREFERRED EMBODIMENT

Figure 1:
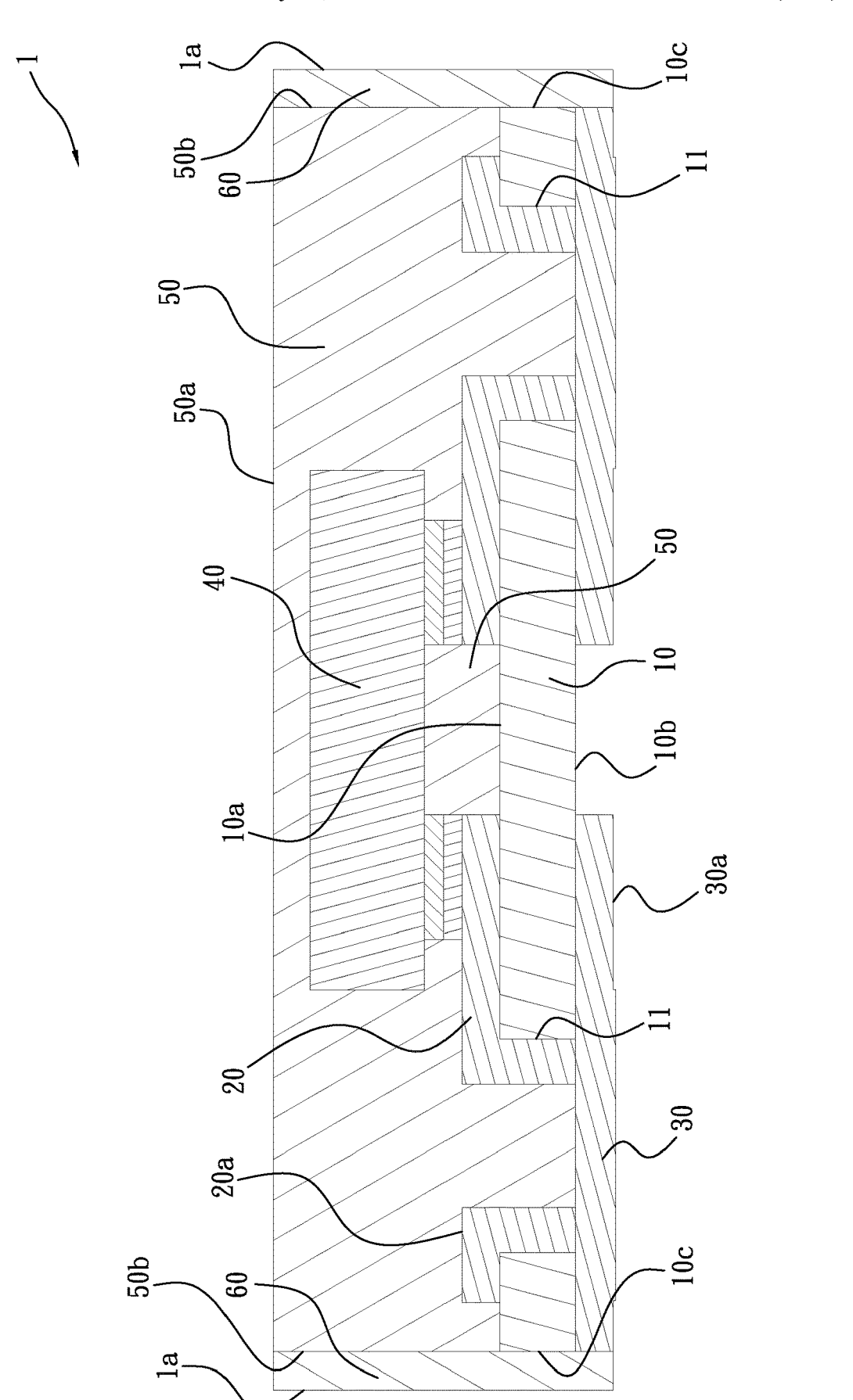
FIG. 1 is a sectional view of an embodiment of a chip package according to the present invention.
Figure 7:
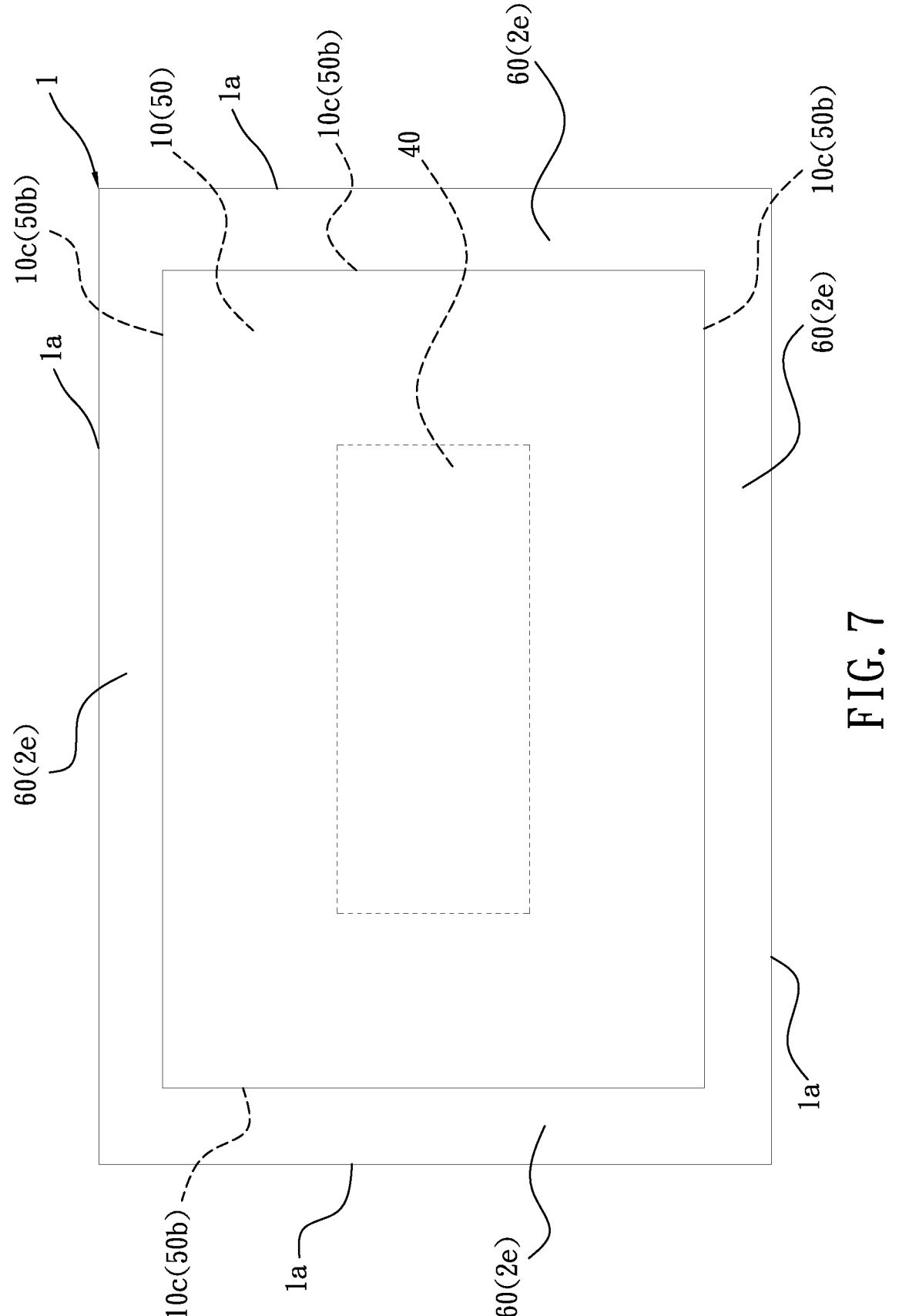
FIG. 7 is a top view of a chip package of an embodiment according to the present invention.

Refer to FIG. 1, a chip package having four sides provided with electromagnetic interference (EMI) shielding layers correspondingly according to the present invention is provided. The chip package 1 of the present invention is a rectangular body having four lateral sides 1a (as shown in FIG. 7). The chip package 1 includes a substrate 10, at least one first circuit layer 20, at least one second circuit layer 30, at least one chip 40, an insulating layer 50, and four electromagnetic interference (EMI) shielding layers 60.

As shown in FIG. 1, the substrate 10 consists of a first surface 10a, a second surface 10b opposite to the first surface 10a, and four lateral sides 10c (as shown in FIG. 7). At least one hole 11 is formed and disposed on the first surface 10a of the substrate 10. In the embodiment shown in FIG. 1, there are two blinds holes 11 but the number of the hole 11 is not limited.

The respective first circuit layers 20 are disposed on the first surfaces 10a of the substrates 10 and extending to an inner surface of the respective holes 11 of the substrate 10.

The first circuit layer 20 is provided with a first surface 20a and the second circuit layer 30 is arranged at the second surface 10b of the substrate 10. The first circuit layer 20 is extending to and electrically connected with the second circuit layer 30 by the holes 11 of the substrate 10 while the chip 40 is electrically connected with and disposed on the first surface 20a of the first circuit layer 20.

The chip 40 is first electrically connected with first surface 20a of the first circuit layer 20 and then extending to the second circuit layer 30 by the first circuit layer 20 on the inner surface of hole 11. Thereby the respective chips 40 are electrically connected with the outside by the respective second circuit layers 30.

The insulating layer 50 is mounted to the substrate 10, covering the respective chips 40, and provided with four lateral sides 50b (as shown in FIG. 7). The respective lateral sides 50b of the insulating layer 50 and the respective lateral sides 10c of the substrate 10 are located on the same sides correspondingly.

The respective EMI shielding layers 60 are made of metals and located on the respective lateral sides 1a of the chip package 1. The respective EMI shielding layers 60 are disposed on and completely covering the respective lateral sides 10c of the substrate 10 and the respective lateral sides 50b of the insulating layers 50 for preventing the respective first circuit layers 20, the respective second circuit layers 30, and the respective chips 40 form electromagnetic interference (EMI). Moreover, the respective EMI shielding layers 60 also help to improve heat dissipation efficiency of the respective first circuit layers 20, the respective second circuit layers 30, and the respective chips 40. A metal paste 2e by which the respective EMI shielding layers 60 are made of is silver paste, but not limited to the silver paste.

Figure 2:
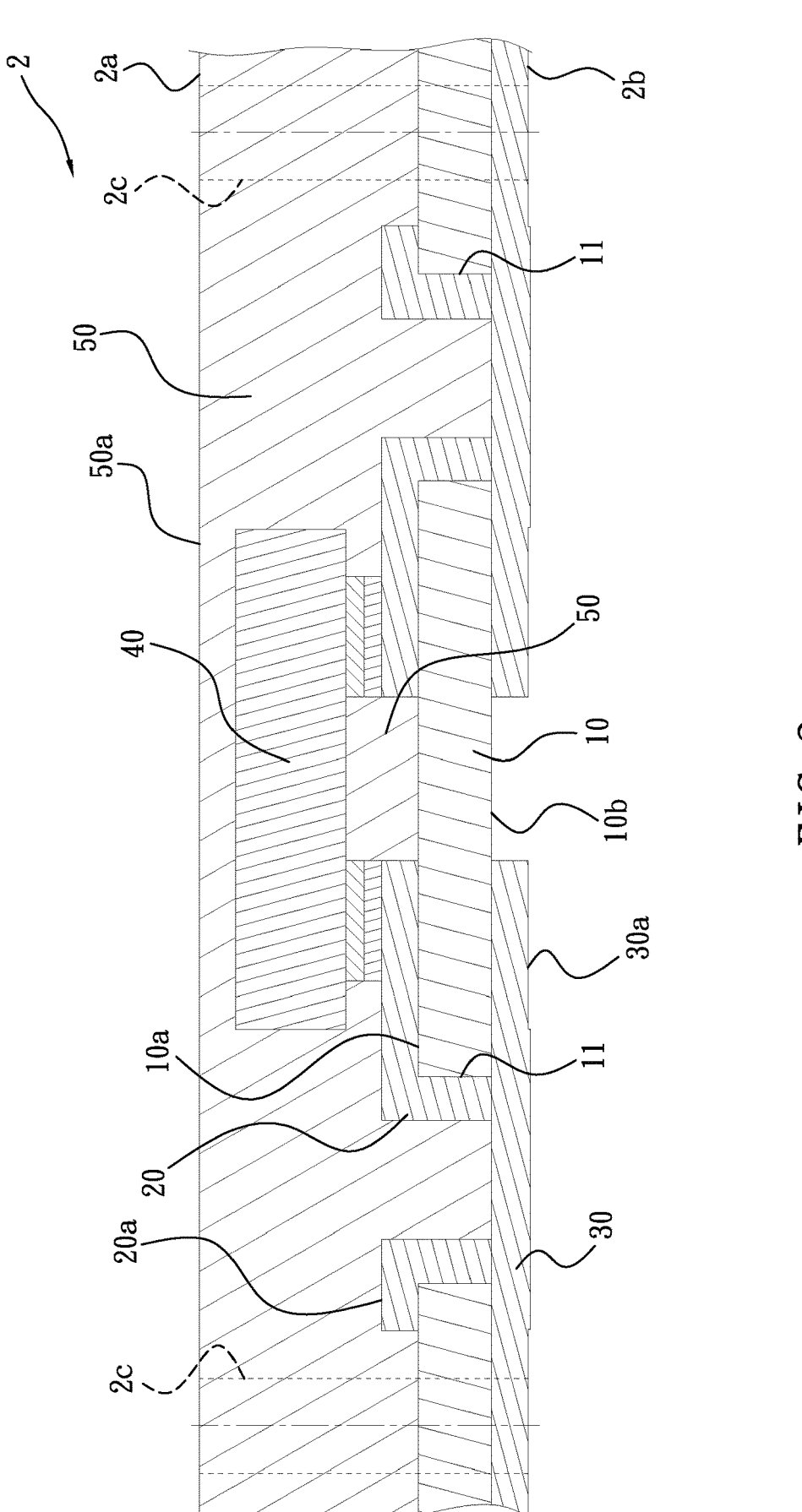
FIG. 2 is a partial sectional view of a support board of an embodiment according to the present invention.
Figure 3:
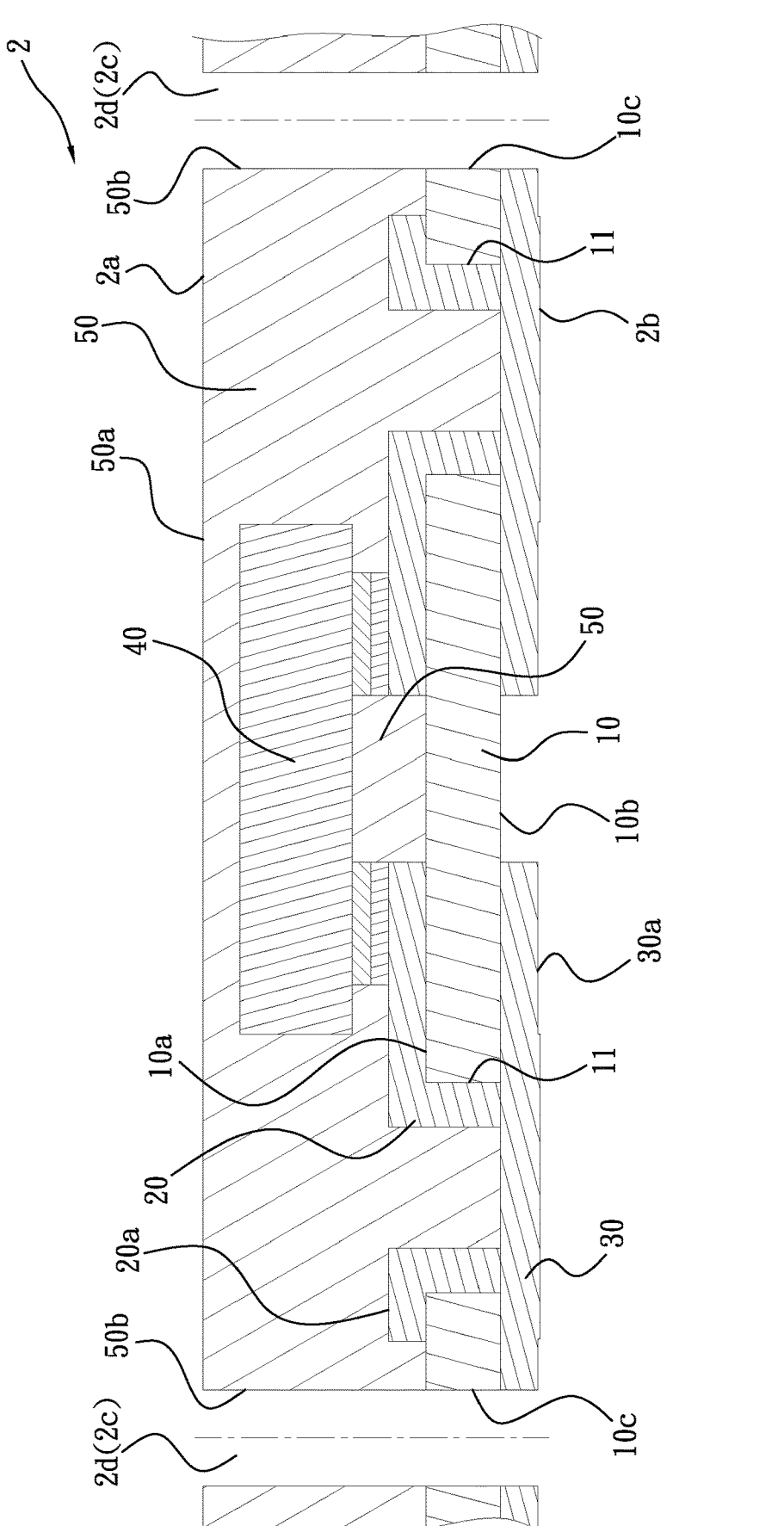
FIG. 3 is a schematic drawing showing slots formed on the support board of the embodiment in the FIG. 2 according to the present invention.
Figure 4:
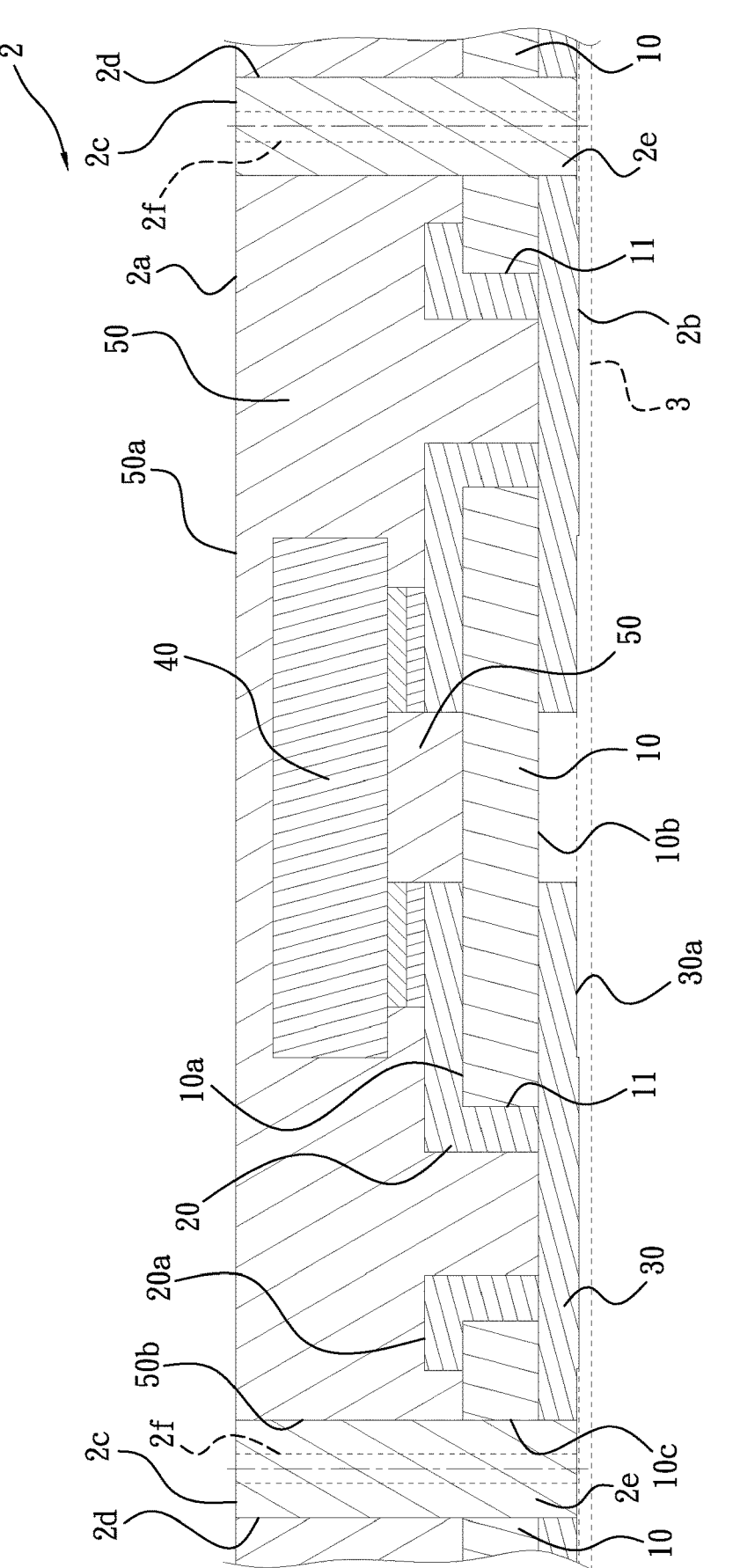
FIG. 4 is a schematic drawing showing slots of the embodiment fully filled with metal paste in the FIG. 3 according to the present invention.
Figure 5:
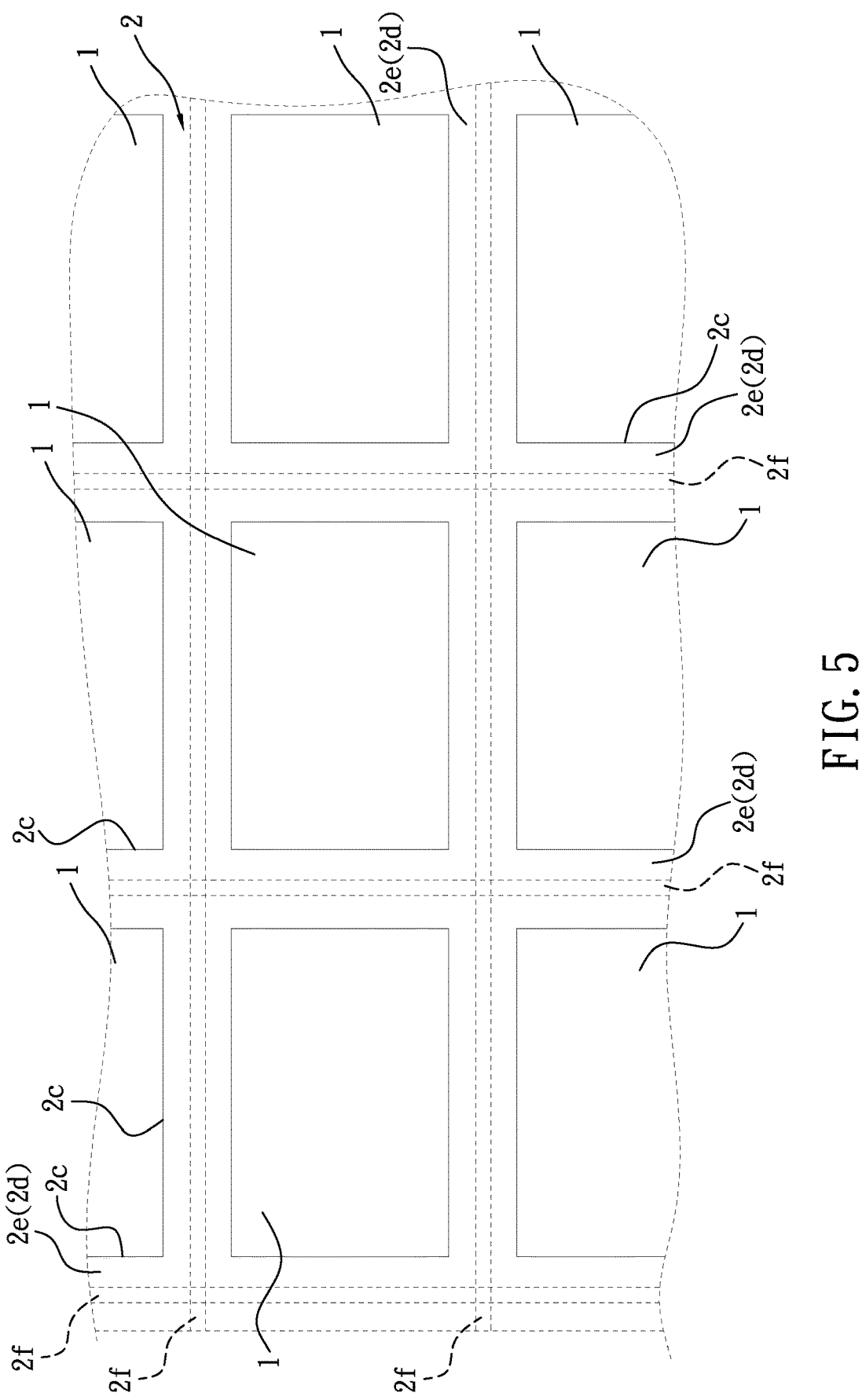
FIG. 5 is a partial top view of a support board of an embodiment according to the present invention.
Figure 6:
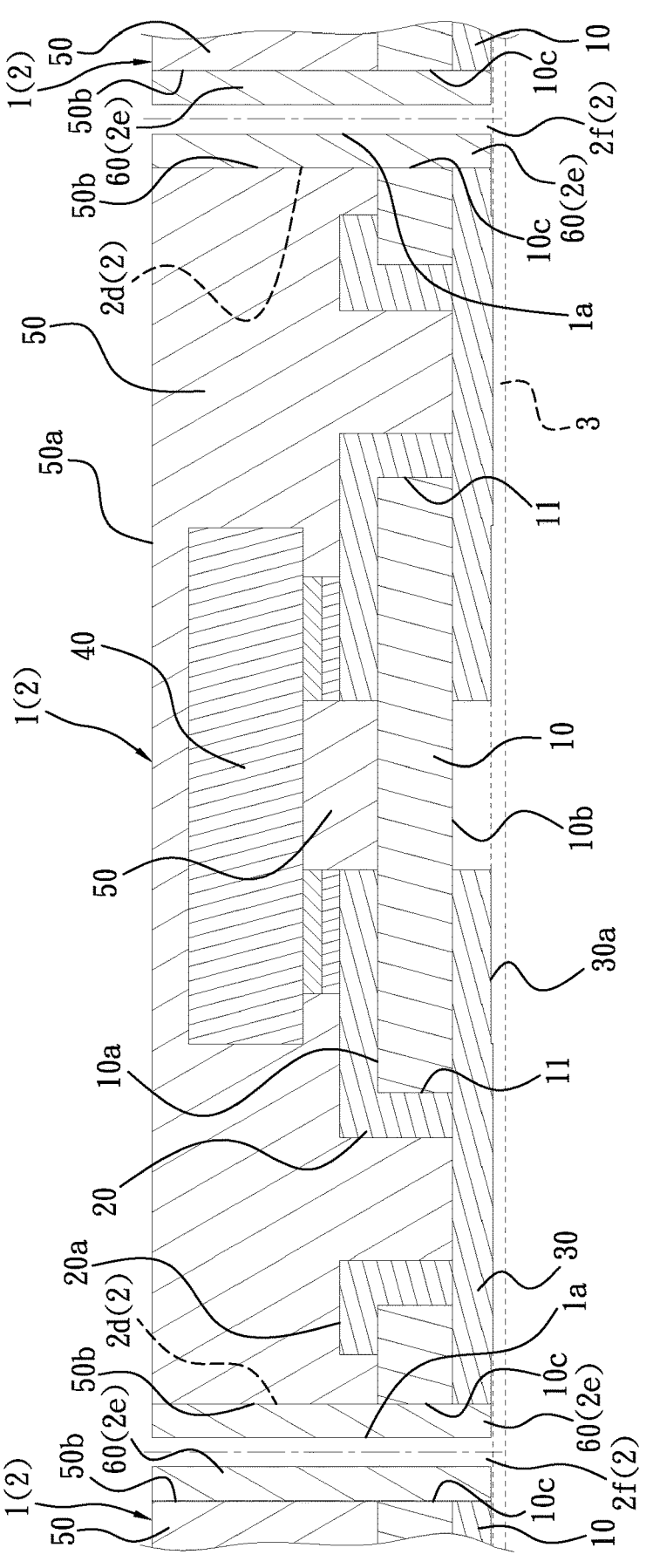
FIG. 6 is a schematic drawing showing chip packages formed on a support board of the embodiment in FIG. 4 according to the present invention.

Refer to FIG. 5 and FIG. 6, the chip package 1 is formed by cutting of a support board 2 which includes a first surface 2a and a second surface 2b opposite to the first surface 2a, as shown in FIG. 2. As shown in FIG. 5, a plurality of the chip packages 1 arranged in an array adjacently and a cutting area 2c is formed between the two adjacent chip packages 1. As shown in FIG. 3, each of the cutting areas 2c is provided with a slot 2d which is penetrating from the first surface 2a to the second surface 2b of the support board 2. The respective slots 2d are located on the respective lateral sides 10c of the substrate 10 and the respective lateral sides 50b of the insulating layer 50 of the chip package 1 correspondingly, as shown in FIG. 6. Refer to FIG. 4 and FIG. 5, the respective slots 2d are fully filled with the metal paste 2e. The cutting is achieved by using cutting tools to cut the support board 2 along the respective cutting areas 2c. After the cutting, a cutting channel 2f whose width or diameter is smaller than that of the slot 2d is formed on the respective cutting areas 2c, as shown in FIG. 6. At the same time, a part of the slot 2d and a part of the metal paste 2e are also removed along with formation of the cutting channel 2f. The rest part of the metal paste 2e not cut yet is left on the respective lateral sides 1a of the respective chip packages 1 to form the respective EMI shielding layers 60 of the respective chip packages 1, as shown in FIG. 6.

Figure 8:
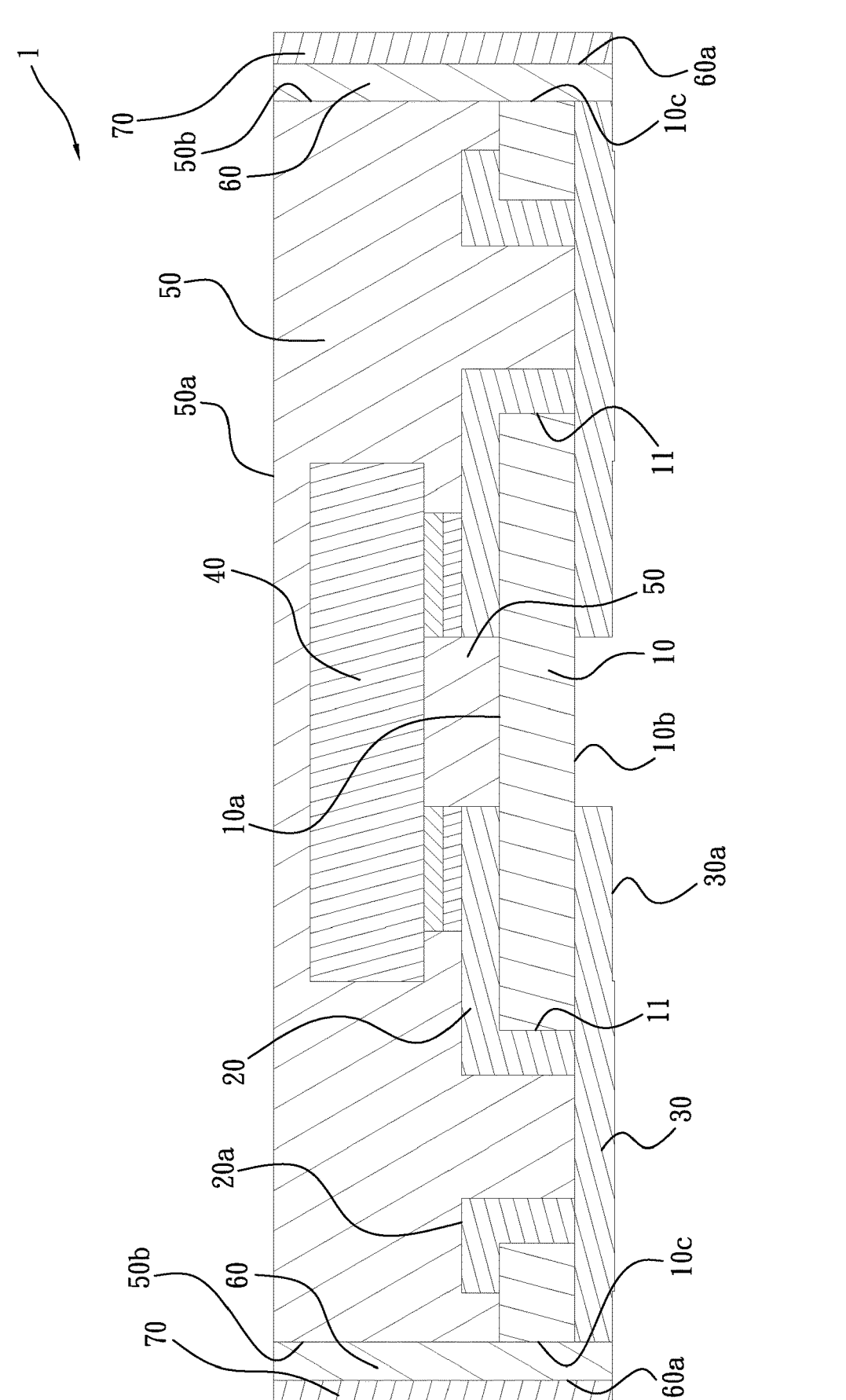
FIG. 8 is a sectional view of a chip package which includes an outer metal layer of an embodiment according to the present invention.

Refer to FIG. 8, a side surface 60a of the respective EMI shielding layers 60 is further provided with an outer metal layer 70, but not limited, in order to improve shielding of EMI. The outer metal layer 70 is a copper metal layer produced by chemical plating, but not limited.

Figure 9:
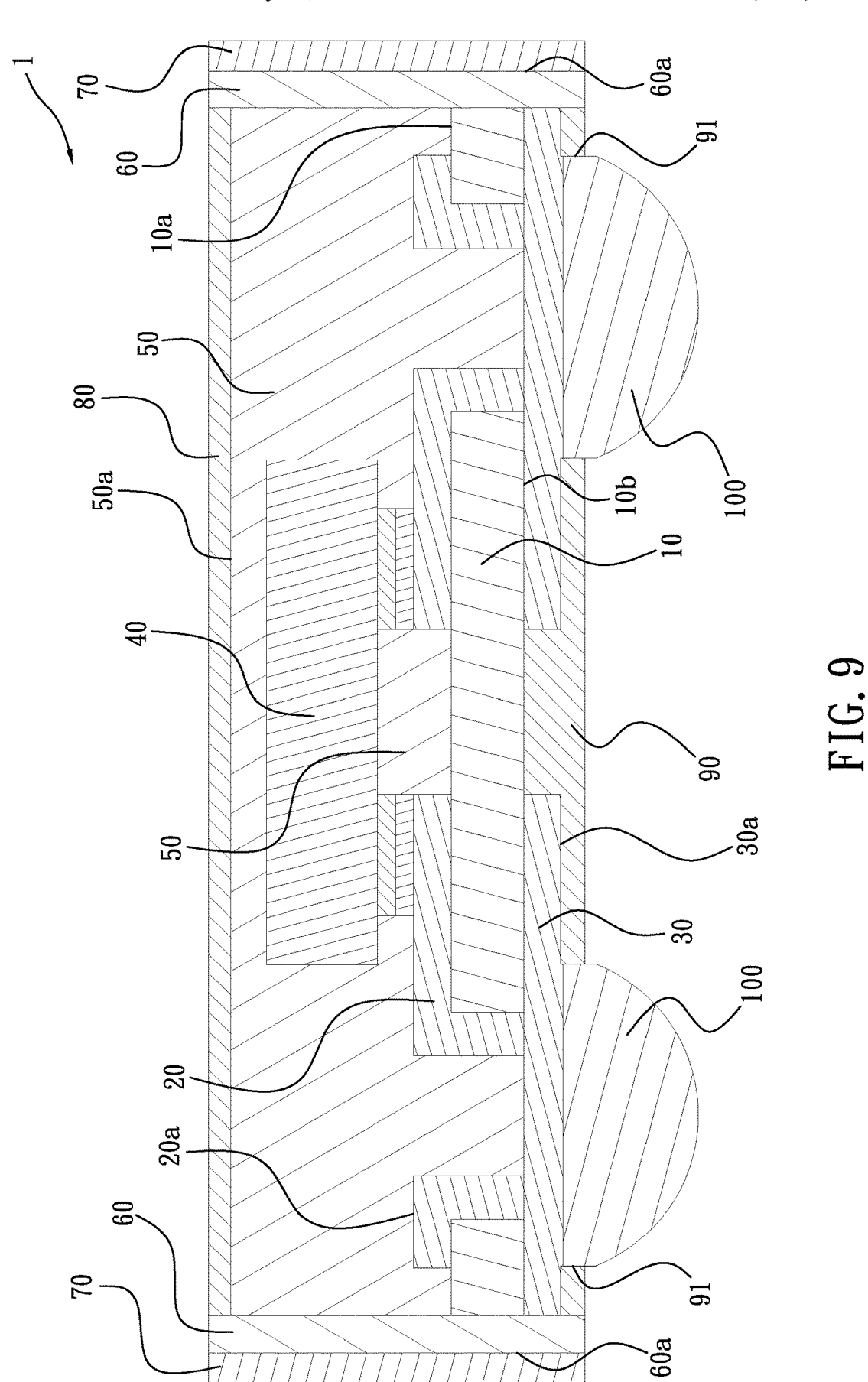
FIG. 9 is a sectional view of a chip package which includes a first protective layer, a second protective layer, and solder balls of an embodiment according to the present invention.

Refer to FIG. 9, the second circuit layer 30 further includes a first surface 30a while the insulating layer 50 is further provided with a first surface 50a. The chip package 1 further includes at least one first protective layer 80 and at least one second protective layer 90 to enhance protection of the chip package 1. The first protective layer 80 and the second protective layer 90 are respectively disposed on the first surface 50*a* of the insulating layer 50 and the first surface 30*a* of the second circuit layer 30. The second protective layer 90 is provided with at least one opening 91 which allows the first surface 30*a* of the second circuit layer 30 to be exposed. As shown in FIG. 9, there are two openings 91 in this embodiment but the number of the opening 91 is not limited.

The respective openings 91 of the respective second protective layers 90 are provided with a solder ball 100 which is electrically connected with the first surface 30*a* of the second circuit layer 30, as shown in FIG. 9. Thereby the chip 40 can be electrically connected with the outside by the solder ball 100. As shown in FIG. 9, there are two solder balls 100 in this embodiment but the number of the solder ball 100 is not limited.

Refer to FIG. 1-7, a method of manufacturing the chip package 1 includes the following steps.

Step S1: providing a support board 2 which includes a first surface 2*a*, a second surface 2*b* opposite to the first surface 2*a*, as shown in FIG. 2, and a plurality of the chip packages 1 arranged in an array adjacently, as shown in FIG. 5. The chip package 1 is a rectangular body having four lateral sides 1*a*, as shown in FIG. 7, and composed of a substrate 10, at least one first circuit layer 20, at least one second circuit layer 30, at least one chip 40, and an insulating layer 50, as shown in FIG. 1. The substrate 10 consists of a first surface 10*a*, a second surface 10*b* opposite to the first surface 10*a*, and four lateral sides 10*c*, as shown in FIG. 7. At least one hole 11 is formed and disposed on the first surface 10*a* of the substrate 10, as shown in FIG. 1. The respective first circuit layers 20 are disposed on the first surface 10*a* of the substrate 10 and extending to an inner surface of the respective holes 11 of the substrate 10. The first circuit layer 20 is provided with a first surface 20*a*, as shown in FIG. 1. The second circuit layer 30 is arranged at the second surface 10*b* of the substrate 10 while the first circuit layer 20 is extending to and electrically connected with the second circuit layer 30 by the hole 11 of the substrate 10, as shown in FIG. 1. The chip 40 is electrically connected with and disposed on the first surface 20*a* of the first circuit layer 20, as shown in FIG. 1. The insulating layer 50 is mounted to the substrate 10, covering the respective chips 40, and provided with four lateral sides 50*b*, as shown in FIG. 7. The respective lateral sides 50*b* of the insulating layer 50 and the respective lateral sides 10*c* of the substrate 10 are located on the same sides correspondingly, as shown in FIG. 6. A cutting area 2*c* is formed between the two adjacent chip packages 1, as shown in FIG. 5. The plurality of chip packages 1 on the support board 2 are further located on a carrier plate 3, but not limited, as shown in FIG. 6.

Step S2: forming at least one slot 2*d* on the respective cutting areas 2*c* of the support board 2 and the slot 2*d* is penetrating from the first surface 2*a* of the support board 2 to the second surface 2*b* of the support board 2, as shown in FIG. 3. The respective slots 2*d* are located on the respective lateral sides 10*c* of the substrate 10 and the respective lateral sides 50*b* of the insulating layer 50 of the chip package 1 correspondingly, as shown in FIG. 6.

Step S3: filling each of the slots 2*d* with a metal paste 2*e* fully, as shown in FIG. 4.

Step S4: cutting the support board 2 along the respective cutting areas 2*c* of the support board 2 by using cutting tools to form a plurality of the chip packages 1, as shown in FIG. 6. After cutting, a cutting channel 2*f* whose width or diameter is smaller than that of the slot 2*d* is formed on the respective cutting areas 2*c* while a part of the slot 2*d* and a part of the metal paste 2*e* are also removed along with the formation of the cutting channel 2*f*. The rest part of the metal paste 2*e* not cut yet is left on an outer edge of the respective chip packages 1 to form the respective EMI shielding layers 60 of the respective chip packages 1. The carrier plate 3 is removed after completing the cutting of the support board 2, but not limited.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

The invention claimed is:

1. A method of manufacturing a chip package having four sides provided with electromagnetic interference (EMI) shielding layers correspondingly comprising the steps of:

Step S1: providing a support board which includes a first surface, a second surface opposite to the first surface, and a plurality of a chip packages arranged in an array at the support board; the chip package is a rectangular body with four lateral sides and composed of a substrate, at least one first circuit layer, at least one second circuit layer, at least one chip, and an insulating layer; wherein the substrate consists of a first surface, a second surface opposite to the first surface, and four lateral sides; wherein at least one hole is formed and disposed on the first surface of the substrate; wherein each of the first circuit layer is disposed on the first surface of the substrate and extending to an inner surface of the hole of the substrate while each of the first circuit layer is provided with a first surface; wherein each of the second circuit layer is arranged at the second surface of the substrate; wherein each of the first circuit layer is extending to and electrically connected with each of the second circuit layer by the hole of the substrate; wherein the chip is electrically connected with and disposed on the first surface of each of the first circuit layer; wherein the insulating layer is mounted to the substrate, covering the chip, and provided with four lateral sides; each of the lateral sides of the insulating layer and each of lateral sides of the substrate are located on a same side correspondingly; wherein the chip is first electrically connected with the first surface of each of the first circuit layer electrically connected to each of the second circuit layer by each of the first circuit layer on the inner surface of the hole so that the chip is electrically connected outwards by each of the second circuit layer; wherein a cutting area is located between the two adjacent chip packages;

Step S2: forming at least one slot on the cutting area of the support board and each of slot is penetrating from the first surface of the support board to the second surface of the support board; wherein each of slot is located on lateral side of the substrate and each of lateral side of the insulating layer of the chip package;

Step S3: filling each of slot with a metal paste fully; and

Step S4: cutting the support board along the cutting areas by using cutting tools to form a plurality of the chip packages; wherein a cutting channel whose width or diameter is smaller than a width or diameter of each of slot is formed on each of the cutting areas while a part of each of slot and a part of the metal paste are also removed along with formation of the cutting channel and a rest part of the metal paste not cut yet is left on an outer edge of the chip package to form at least one EMI shielding layer of the chip package; wherein each of EMI shielding layer is located on each of the lateral side of the chip package and covering each of lateral side of the substrate and each of lateral side of the insulating layer completely.

2. The method of manufacturing a chip package as claimed in claim 1, wherein in the step S1, the plurality of the chip packages on the support board is further located on a carrier plate.

3. The method of manufacturing a chip package as claimed in claim 1, wherein in the step S4, the carrier plate is removed after completing the cutting of the support board.

4. The method of manufacturing a chip package as claimed in claim 2, wherein in the step S4, the carrier plate is removed after completing the cutting of the support board.

* * * * *